United States Patent [19]
Bell et al.

[11] 4,253,059
[45] Feb. 24, 1981

[54] EPROM RELIABILITY TEST CIRCUIT

[75] Inventors: Antony G. Bell, Sunnyvale; Rajesh H. Parekh, San Jose, both of Calif.

[73] Assignee: Fairchild Camera & Instrument Corp., Mountain View, Calif.

[21] Appl. No.: 39,096

[22] Filed: May 14, 1979

[51] Int. Cl.³ .................................... G01R 15/12
[52] U.S. Cl. ........................ 324/73 R; 324/158 R
[58] Field of Search .......... 324/73 R, 73 PC, 73 AT, 324/158 R, 158 T; 371/21; 364/200

[56] References Cited

U.S. PATENT DOCUMENTS

| | | | |
|---|---|---|---|
| 3,122,724 | 2/1964 | Felton et al. | 371/21 |
| 3,478,286 | 11/1969 | Dervan | 371/21 |
| 3,795,859 | 3/1974 | Benante et al. | 371/21 |

*Primary Examiner*—David K. Moore
*Attorney, Agent, or Firm*—Paul J. Winters; Theodore Scott Park; Michael J. Pollock

[57] ABSTRACT

On-chip circuitry for measuring the threshold voltage and hence the data retention reliability of the floating gate transistors used in erasable programmable read-only computer memories. Upon the application of a program "verification" signal, an externally adjustable and calibrated voltage ramp is applied by the test circuit to each of the memory X-lines coupled to the gate elements of the memory transistors. The threshold voltage of a selected transistor can then be determined by increasing the voltage ramp to the point at which the transistor will read out.

7 Claims, 1 Drawing Figure

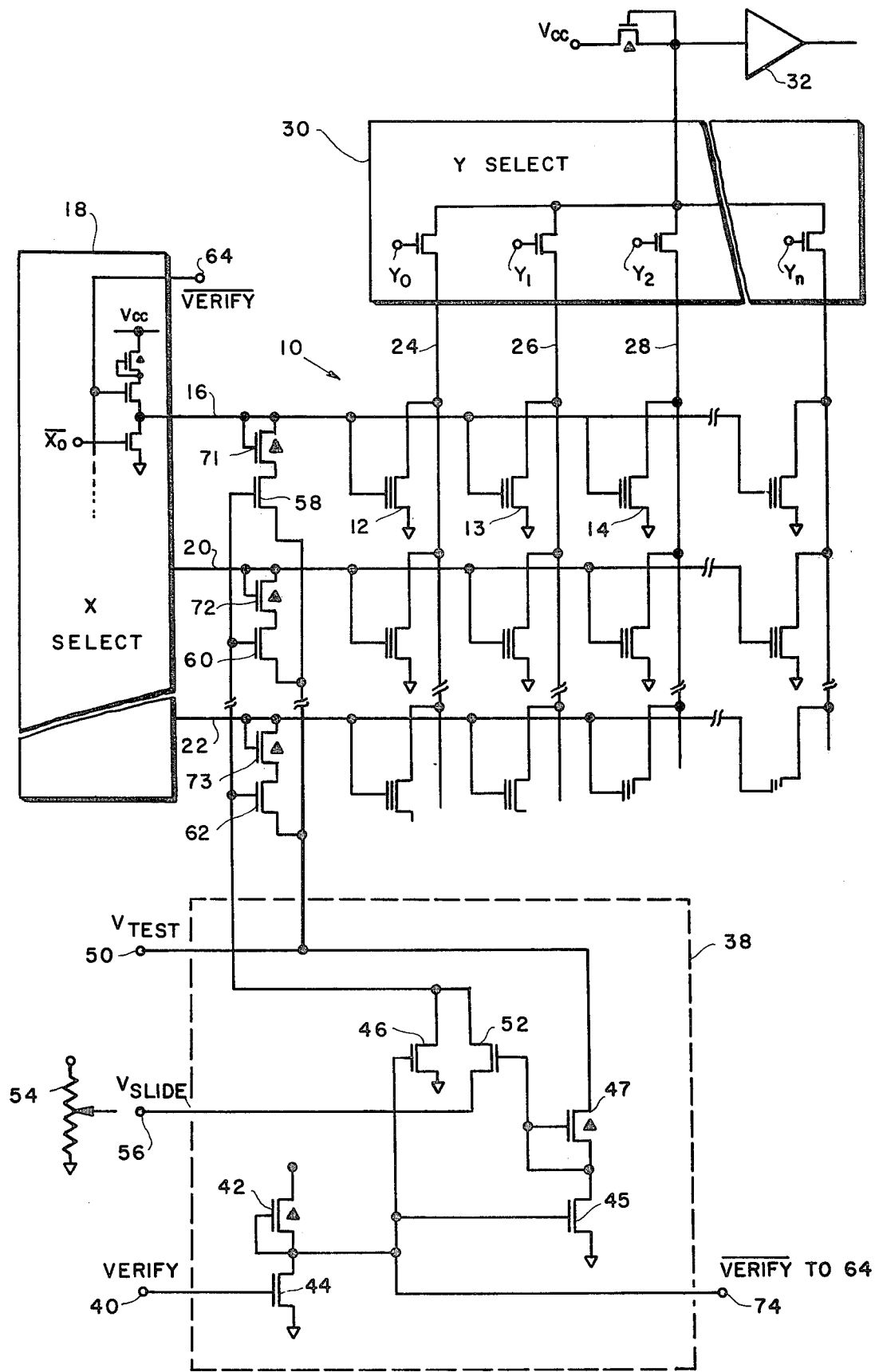

EPROM RELIABILITY TEST CIRCUIT

BRIEF SUMMARY OF THE INVENTION

This invention relates to read-only digital memories and particularly to circuitry for measuring the data retention reliability of programmed and operational erasable programmable read-only memories.

Modern digital computers generally employ volatile random access memories for the storage of temporary data and the non-volatile permanent read-only memories, or ROMs, for the storage of permanent data that will be consistently and repeatedly required, such as a particular operating program for the computer. In the modern mini or microcomputer, ROMs are in the form of integrated circuits that are generally programmed in large quantities by the manufacturer to the consumer's specifications for performing a particular computer operation.

A variation of the ROM with its manufacturer produced program, is the programmable ROM (or PROM) which may be purchased by the consumer without a program and later programmed as desired to the consumer's particular needs. These PROMs are specifically suitable for special purpose computers designed to perform a fixed program of computations on the particular input data and are very economical for small quantity applications. The PROM program is permanent and cannot be corrected or changed due to error or program obsolescense.

In order to overcome the shortcomings of the non-changeable PROM, erasable PROMs (hereinafter EPROM) were developed. The EPROM may be programmed in much the same manner as the ROM or PROM but if errors in programming are made or if it is desired to erase or change the program, the EPROM may be completely erased by the application of ultraviolet radiation. In general, each memory cell of an EPROM is formed of a silicon gate MOS transistor having a second "floating" gate element formed between the n-channel and the conductive gate element and insulated therefrom. To program a memory transistor, voltage levels higher than the normal operating voltage are suitably applied to the gate and source elements so that the floating gate element will absorb and hold a small electron charge. This floating gate charge increases the conduction threshold on the control gate of the transistor from about 2 volts to approximately 10 volts. Thereafter, when the programmed memory is to be read, a voltage lower than the threshold level of a programmed transistor but higher than the minimum threshold voltage of the unprogrammed EPROM transistors must be applied to the control gate. In erasing programmed transistors, the radiation by ultraviolet permits the discharge of the electrons from the floating gate.

While very versatile and reliable under normal conditions, EPROMs have inherent problems that may seriously affect reliability. The electron charge formed on the floating gate during programming of the memory transistor is directly related to the effective life of the memory cell. That is, the larger the charge, the longer the memory, and a fully charged memory cell may have a normal life of approximately 100 years. Unfortunately, programmed EPROMs may be subjected to various forms of radiation that may permit the electron charge to deteriorate from the floating gate element thereby materially reducing the memory life and reliability. If there were some means for measuring the electron charges on the floating gates of each cell in a memory, the life expectancy of that memory could be determined and if inadequate, the EPROM cells could be re-programmed to extend the memory life for another full term.

The charge on the floating gate of a memory transistor and hence its expected useful memory life may be determined by measuring the control gate voltage necessary to turn on the transistor. A fully programmed memory transistor having a memory life of approximately 100 years may have a control gate voltage threshold of approximately 10 volts. As the electron charge on the floating gate is partially dissipated, there may be an enabling control gate threshold voltage of perhaps 4 or 5 volts. The solution, therefore, is to determine memory cell life by the measurement of the control gate voltage threshold necessary to enable the memory transistor.

Briefly described, the test circuitry of the invention is an n-channel MOS circuit, on the same IC chip with the EPROM, that permits the control gate voltage enabling threshold to be measured in each or in any selected memory transistor in the EPROM. The test circuit requires one "slide" voltage input terminal on the IC chip in addition to a signal on the conventional "verify" input. An external slide voltage ramp varying between approximately 2 and 12 volts D.C. is supplied to the slide voltage input terminal and, when enabled by the verify signal, the circuit transfers the slide voltage to the control grid of all memory transistors connected to the particular X-line selected by the memory X-line decoder. The drain element of each memory transistor in the selected X-line is connected to a separate Y-line and to an output buffer so that when there is buffer readout, the particular value of the applied slide voltage will indicate the threshold voltage of the particular selected transistor and, consequently, its expected memory life and reliability. The circuit may therefore be useful in "mapping" a fully programmed EPROM memory matrix as well as determining the threshold level of the charged or programmed cells.

DESCRIPTION OF THE DRAWING

The single drawing illustrating a preferred embodiment of the invention contains a schematic diagram of the test circuit coupled to a small section of an EPROM.

DETAILED DESCRIPTION OF THE PREFERRED EMBODIMENT

Illustrated in the circuit diagram is a portion of a typical EPROM including the matrix 10 of a plurality of dual gate polysilicon transistors constructed with one gate floating between the n-channel and the control gate. The EPROM transistors forming the matrix 10 are arranged in a plurality of rows and columns with each row, such as the row including transistors 12, 13 and 14 coupled to one "X-select" output line 16 of the typical X decoder or select circuit 18. The X-line 16 is coupled to all control gates in the EPROM transistors associated with that line, such as transistors 12, 13 and 14, and similar X-select lines, such as lines 20 and 22, are similarly coupled to the control gates of EPROM transistors in their respective rows. The source conductors of all EPROM transistors are connected to ground reference potential whereas the drain elements of each column of EPROM transistors in the matrix 10 are connected to a Y-line such as lines 24, 26 or 28. Each of the Y-lines is coupled via a Y-line selector to an output sense amplifier, such as amplifiers 32. The selected Y-line is charged by a typical pre-charge circuit 30.

To read the EPROM, the pre-charge circuit 30 charges a particular Y-line such as the line 24, thereby enabling all EPROM transistors coupled to line 24. Each X-line, such as line 16, 20 or 22, is normally held at ground reference by the X-select circuit 18; but when a particular X-line is selected, such as line 16, it is disconnected from ground and a gate voltage at a level between the threshold levels of unprogrammed and programmed EPROM transistors is applied. Therefore, if X-line 16 is to be read, all remaining X-lines, such as lines 20 and 22, will be at ground potential and all EPROM transistors coupled to the X-line 16 will receive a positive gate voltage on their control gates. However, since Y-line 24 is the only Y-line selected, it is clear that EPROM transistor 12 will be the only cell to be selected in the matrix 10.

As previously discussed, the dual gate EPROM transistors are programmed by the application of appropriate programming potentials to selected EPROM transistors to thereby charge the floating gates. A programmed EPROM transistor with a fully charged floating gate may have an effective memory life of approximately 100 years, whereas a programmed transistor having a charge that has deteriorated due to irradiation or the like, will have a lower threshold and may eventually be turned on by the applied gate voltage to thereby generate an erroneous output. The test circuitry associated with the EPROM matrix 10 will determine the conduction threshold voltage of any selected EPROM transistor in the matrix 10. Transistors having a threshold voltage of $7\frac{1}{2}$ to 8 volts may be fully charged and will have a long memory life; however, when the threshold voltage drops to a level of approximately 5 volts, a deterioration of data retention is indicated and the memory life may be in the order of only one year. Thus, by checking the threshold voltage of each programmed EPROM transistor, that is, the voltage applied to the control gate that will provide a readout of that transistor, the program life and the memory reliability may be determined.

The circuitry contained in the dashed box 38 in the drawing contains the on-chip slide voltage test circuit. The test circuit is operative only in the program "verify" mode of the memory and the positive going verify signal is applied to the input terminal 40 and is inverted by an inverter comprising transistors 42 and 44. The terminal 40 is coupled to the control gate of transistor 44, the source element of which is coupled to ground potential and the drain element of which is coupled to the source element of a depletion transistor 42. The drain of transistor 42 is coupled to $V_{cc}$ of typically 5 volts and the gate of transistor 42 is coupled to its drain and to the control gates of enhancement transistors 45 and 46, the source element of transistor 46 being grounded. Transistors 45 and 46 are therefore normally conductive and are rendered non-conductive by the application of the positive verify signal on input terminal 40. The source of transistor 45 is connected to ground reference and the drain element is connected to the source element of transistor 47. The drain element of transistor 47 is coupled to input terminal 50 to which is applied a D.C. test voltage higher than the highest threshold voltage of any programmed EPROM transistor, for example approximately 25 volts. The gate of transistor 47 is coupled to its source element and to the gate of an enhancement transistor 52. Therefore, the application of a positive going "verify" signal to the terminal will render transistor 45 non-conductive so that substantially the entire D.C. test voltage applied to the input terminal 50 will be applied to the gate of transistor 52 to render it fully conductive.

A ramp voltage typically variable between levels greater than the threshold extremes of unprogrammed and programmed EPROM transistors, for example between 2 to 12 volts D.C., is externally generated, preferably by associated computer circuitry but illustrated by the potentiometer 54. The variable or slide voltage is applied to input terminal 56 which is coupled to the drain of transistor 52. The source element of transistor 52 is coupled to the drain of transistor 46 and to the control gates of each of a plurality of enhancement transistors, such as transistors 58, 60 and 62, associated with each of the X-lines of the matrix 10. The source element of each of the X-line transistors 58, 60 and 62 is coupled to its respective X-line through a gate-source connected depletion load transistor such as transistors 71, 72 or 73, and all drain elements are coupled together and to the conductor carrying the 25-volt test voltage applied to terminal 50. If desired, the X-line transistors 58, 60 or 62 may be connected so that their drain elements are connected to the source of transistor 52 and their control gates connected to the test voltage conductor or terminal 50. In this configuration, the test voltage will fully turn on the X-line transistors to transfer the actual slide voltage through the load resistors 71, 72 and 73 to the respective X-lines.

When the circuitry contained in the dash box 38 is enabled by the application of a positive going veryify signal to input terminal 40, the gate and source of transistor 52 are disconnected by transistor 46 from ground reference potential and the full high test voltage is applied to render transistor 52 fully conductive. The varying voltage applied to input terminal 56 is therefore applied to the gate elements of the X-line enhancement transistors, such as 58, 60 and 62, and turn them on. During a threshold level test operation, the "verify" signal, which is also applied to the X-select circuit 18 at input terminal 64, will disconnect only the selected X-line from ground and $V_{cc}$ so that it may receive the slide voltage via the enhancement transistors, such as 58, 60 and 62, and the load resistors such as 71, 72 and 73.

To measure the threshold of any EPROM transistor, such as transistor 12, the positive "verify" signal is first applied to terminal 40 and then X-line 16 and Y-line 24 are selected in any order. The output buffer 32 will not detect any data as X-line 16 is selected and still at pre-charged potential. Now the slide voltage is applied to terminal 56 in the form of a slow ramp and the output of buffer 32 is constantly observed. At the critical threshold level of EPROM transistor 12, it will turn on to discharge the Y-line 24 to ground potential and buffer 32 will detect that discharge. At this point the slide voltage is measured and the threshold of transistor 12 will equal that measured slide voltage less the threshold voltage drop of the enhancement transistor 58.

The EPROM test circuit may readily be employed to map large memory arrays. In such a test, a fixed voltage, at a level between the threshold voltage of programmed and un-programmed EPROM transistors, is applied to the V-slide input and test and verify voltages are applied to terminals 50 and 40, respectively. The memory X and Y-select citcuits are then activated and the state of each transistor will be sensed through amplifier 32 to provide a map of the memory.

We claim:

1. Test circuitry for enabling the measurement of the read signal threshold voltage necessary to produce a readout of a selected EPROM matrix memory cell common to one of a plurality of cell enabling lines and one of a plurality of cell read signal lines, said circuit including:
   first input means for receiving a test voltage at a level higher than the threshold level of any cell in the matrix;
   second input means for receiving a measurable externally generated slide voltage variable between levels higher and lower than the threshold voltage of any cell in said matrix; and
   a voltage control transistor coupled to said first input means, said second input means, and each of the cell read signal lines in said matrix for transferring said measurable slide voltage to its respective read signal line.

2. The circuitry claimed in claim 1 wherein said EPROM is a MOS integrated circuit and wherein said test circuitry is formed on the same IC chip with said EPROM.

3. The test circuitry claimed in claim 2 wherein said voltage control transistor is an enhancement transistor having its source and drain electrodes respectively coupled to said first input means and said read signal line, the gate of said transistor being coupled to said second input means.

4. The test circuitry claimed in claim 2 wherein said voltage control transistor is an enhancement transistor having its source and drain electrodes respectively coupled to said second input means and said read signal line, the gate of said transistor being coupled to said first input means for transferring to said read signal line a voltage equal to the voltage applied to said second input means.

5. The test circuitry claimed in claim 3 further including third input means for receiving a test circuitry enabling signal.

6. The test circuitry claimed in claim 5 wherein the conductor coupling said enhancement transistor with said first input means includes a normally non-conductive series switching transistor, that is rendered conductive by the application of said test circuit enabling signal.

7. The test circuitry claimed in claim 6 wherein said third input means includes transistor circuitry responsive to the application of said test circuit enabling signal for disconnecting the control gate of said series switching transistor from ground reference potential and coupling said gate to said first input means for rendering said switching transistor fully conductive.

* * * * *